United States Patent [19]

Popovic

[11] Patent Number: 5,382,824

[45] Date of Patent: Jan. 17, 1995

[54] INTEGRATED CIRCUIT WITH AN INTEGRATED COLOR-SELECTIVE PHOTO DIODE AND AN AMPLIFIER FOLLOWING THE PHOTO-DIODE

[75] Inventor: Radivoje Popovic, Zug, Switzerland

[73] Assignee: Landis & Gyr Business Support AG, Zug, Switzerland

[21] Appl. No.: 91,663

[22] Filed: Jul. 13, 1993

[30] Foreign Application Priority Data

Jul. 16, 1992 [CH] Switzerland .................. 020269/92

[51] Int. Cl.6 .................. H01L 27/14; H01L 31/00
[52] U.S. Cl. .................. 257/464; 257/461; 257/463; 257/539; 257/544
[58] Field of Search .............. 257/461, 463, 464, 536, 257/539, 542, 544, 548, 552

[56] References Cited

U.S. PATENT DOCUMENTS

| | | | |
|---|---|---|---|
| 4,910,570 | 3/1990 | Popovic | 257/290 |
| 4,947,231 | 8/1990 | Palara et al. | 257/539 |
| 5,283,460 | 2/1994 | Mita | 257/461 |

FOREIGN PATENT DOCUMENTS

| | | |
|---|---|---|
| 0296371 | 12/1988 | European Pat. Off. . |
| 0353509 | 2/1990 | European Pat. Off. . |
| 0387483 | 9/1990 | European Pat. Off. . |
| 59-134872 | 8/1984 | Japan . |
| 60-240174 | 11/1985 | Japan . |
| 61-185979 | 8/1986 | Japan .................. 257/464 |
| 2244175 | 11/1991 | United Kingdom . |

OTHER PUBLICATIONS

D. Cook, "Light Sensing with Optical ICs", New Electronics, Bd. 20, Nr. 17, 1 Sep. 1987, London, GB, pp. 33-35.

Primary Examiner—Sara W. Crane
Attorney, Agent, or Firm—Meltzer, Lippe, Goldstein et al.

[57] ABSTRACT

An integrated circuit includes a photo diode having a first electrically isolated portion of an epitaxial layer of a first conductivity type, a first semiconductor layer of a second conductivity type disposed therein, a second semiconductor layer of the first conductivity type disposed in the first semiconductor layer, and a third semiconductor layer of the second conductivity type disposed in the second semiconductor layer. A vertical bipolar transistor connected to the diode includes a collector layer including a second electrically isolated portion of the epitaxial layer of the first conductivity type, a base layer of the second conductivity type, disposed therein, which base layer is approximately as thick, in a direction X perpendicular to the surface, and is doped with an approximately equal concentration of impurities, as the first semiconductor layer of the photo diode, and an emitter layer of the first conductivity type disposed in the base layer which is approximately as thick, in the direction X, and is doped with an approximately equal concentration of impurities, as the second semiconductor layer of the photo diode. The second semiconductor layer is doped with a concentration Y of impurities and has an active region with a thickness $W_1$ in the direction X and the base layer is doped with a concentration Z of impurities and has an active region with a thickness $W_2$ in the direction X such that $$\int_{W_1} Y \cdot dx > \int_{W_2} Z \cdot dx$$

where x is measured in the direction X.

5 Claims, 2 Drawing Sheets

INTEGRATED CIRCUIT WITH AN INTEGRATED COLOR-SELECTIVE PHOTO DIODE AND AN AMPLIFIER FOLLOWING THE PHOTO-DIODE

FIELD OF THE INVENTION

The present invention relates to integrated circuits. In particular, the present invention relates to a monolithic integrated circuit on which both a color-selective photo diode and an amplifier connected downstream therefrom are formed.

BACKGROUND OF THE INVENTION

UK Patent No. 2 244 175 A teaches the integration of a color-selective photo diode and an appertaining downstream amplifier known from FIG. 9 of U.S. Pat. No. 4,910,570 A into one single housing. A color-selective photo diode is disposed beneath a selectively light-permeable inlet window provided with an anti-reflection coating. The color-selective integrated photo diode is provided with a first semiconductor layer of a first conductivity type p++ located at the surface of a second semi-conductor layer of a second conductivity type N+ which is in turn located at the surface of a third semiconductor layer of the first conductivity type P, whereby the latter is in the form of a substrate. Each of the three semiconductor layers is provided with an ohmic connection contact. The anti-reflection coating acts as an interference filter which is formed by building up alternating oxide and metal layers. Furthermore, another color filter is installed before the interference filter.

It is the object of the invention to improve the above-mentioned arrangement so that the color-selective photo diode and the downstream amplifier can be integrated in one single semiconductor chip.

SUMMARY OF THE INVENTION

This and other objects are achieved by the present invention which provides an integrated photo diode amplifier circuit with a vertical bipolar transistor connected downstream from a photo diode which transistor and photo diode are provided in the same semiconductor chip. The photo diode includes a first electrically isolated portion of an epitaxial layer of a first conductivity type. A first semiconductor layer of a second conductivity the is disposed in the electrically isolated epitaxial layer portion at a surface of the integrated circuit. The photo diode also includes a second semiconductor layer of the first conductivity type disposed in the first semiconductor layer at the integrated circuit surface, and a third semiconductor layer of the second conductivity type disposed in the second semiconductor layer at the integrated circuit surface. The vertical bipolar transistor includes a collector layer having a second electrically isolated portion of the epitaxial layer of the first conductivity type. The vertical bipolar transistor also has a base layer of the second conductivity type, disposed in the second electrically isolated portion of the epitaxial layer at the surface of the integrated circuit. The base layer is approximately as thick, in a direction X perpendicular to the integrated circuit surface, and is doped with an approximately equal concentration of impurities, as the first semiconductor layer of the photo diode. The vertical bipolar transistor also has an emitter layer of the first conductivity type disposed in the base layer at the integrated circuit surface. The emitter layer is approximately as thick, in the direction X, and is doped with an approximately equal concentration of impurities, as the second semiconductor layer of the photo diode. The second semiconductor layer is doped with a concentration Y of impurities and has an active region located below the third semiconductor layer with a thickness $W_1$ in the direction X. Furthermore, the base layer is doped with a concentration Z of impurities and has an active region with a thickness $W_2$ in the direction X such that $$\int_{W_1} Y \cdot dx > \int_{W_2} Z \cdot dx$$

where x is measured in the direction X.

BRIEF DESCRIPTION OF THE DRAWING

An example of an embodiment of the invention is shown in the drawing and is described in further detail below.

Identical reference numbers designate the same parts in all the figures of the drawing.

DETAILED DESCRIPTION OF THE INVENTION

Figure 1:
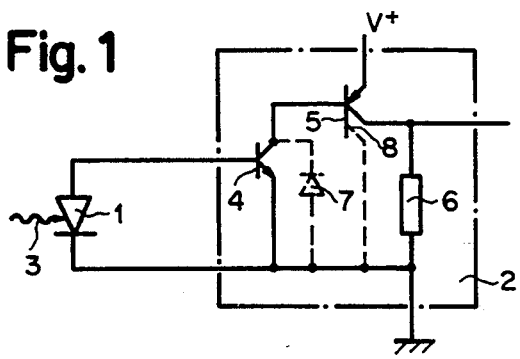
FIG. 1 shows a circuit diagram of an amplifier triggered by a color-selective photo diode.

Referring to FIG. 1, an arrangement according to one embodiment of the present invention is shown with an integrated color-selective photo diode 1 connected to the input, e.g., a two pin input, of an amplifier stage 2, the amplifier 2 thus being electrically connected downstream of the photo diode 1. The photo diode 1 detects, e.g., ultraviolet or yellow light 3. The amplifier 2 contains at least one vertical bipolar transistor 4 which can be formed with the known construction represented in FIG. 1. In such a case, the base of the vertical bipolar transistor 4 constitutes a first terminal of the two pin input input of the amplifier 2 to which the anode of the photo diode 1 is connected. The collector of the vertical bipolar transistor 4 is connected to the base of a lateral bipolar transistor 5 the collector of which constitutes an output of the amplifier 2. The vertical transistor 4 can be a NPN transistor, while the lateral bipolar transistor 5 can be a PNP transistor. The emitter of the lateral bipolar transistor 5 is then connected to a positive terminal V+ of a d.c. voltage supply (the other terminal of the d.c. supply not shown in FIG. 1, is illustratively grounded). In this case, the second terminal of the two pin input of the amplifier 2, and the emitter of the vertical bipolar transistor 4, are connected directly to ground and the collector of the lateral bipolar transistor 5 is connected to ground via an integrated resistance 6. The integrated resistance 6 is used, e.g., for temperature compensation of the current amplification of the bipolar transistors 4 and 5. In FIG. 1, a parasitic diode 7 located between the collector and the emitter of the vertical bipolar transistor 4 and a grounded parasitic collector 8 of the lateral bipolar transistor 5 are represented by broken lines.

The photo diode 1 and the amplifier 2 together with its bipolar transistors 4 and 5 and with its resistance 6 are integrated into one single integrated circuit even though the photo diode 1, the bipolar transistors 4 and 5 and the resistance 6 are shown separately in FIGS. 2 to 6. The integrated circuit contains a common substrate 9 for all integrated components on which one single, also common, epitaxy layer 10 is formed. The epitaxy layer 10 is divided in a known manner into adjoining and mutually electrically isolated islands. Each of the components, 1, 4, 5, 6, etc., is located in a different one of these electrically isolated islands by means of a tubular isolation ring 11a;11b (see FIG. 2) or 12a;12b (see FIG. 3) or 13a;13b (see FIG. 4) or 36a;36b (see FIGS. 5 and 6) extending through the entire depth of the epitaxy layer 10 and laterally surrounding the island concerned. In each instance, the isolation rings 11a;11b, 12a;12b, 13a;13b, 36a;36b are shown in the drawing as two cross-sectional surfaces 11a and 11b or 12a and 12b or 13a and 13b or 36a and 36b because of their tubular configuration.

In the arrangement according to the invention, layers and connection contacts made of a first conductivity type P or N and of a second conductivity type N or P are used. For reasons simplification and greater clarity, it is assumed below and in the drawing that the first conductivity type is P and the second conductivity type is N. It should be well understood here opposite is also possible in the arrangement according to the invention.

Substrate 9 and each of the isolation rings 11a;11b, 12a;12b, 13a;13b and 36a;36b are made of a semiconductor material of the first conductivity type P and the epitaxy layer 10 is made of a semiconductor material of the second conductivity type N. Each isolation ring 11a;11b, 12a;12b, 13a;13b and 36a;36b is made of a semiconductor material of the first conductivity type P and the epitaxy layer 10 is made of a semiconductor material of the second conductivity type N. Each isolation ring 11a;11b, 12a;12b, 13a;13b and 36a;36b has a connection contact 11c;11d (see FIG. 2) or 12c;12d (see FIG. 3) or 13c;13d (see FIG. 4) or 36c;36d (see FIGS. 5 and 6) at its surface. Each connection contact 11c;11d, 12c;12d, 13c;13d or 36c;36d includes a larger connection contact 11c or 12c or 13c or 36c of the first conductivity type P which larger connection contacts 11c, 12c, 13c and 36c are each provided with a smaller connection contact 11d or 12d or 13d or 36d, also of the first conductivity type P, doped more heavily with impurities. Similarly, the epitaxy layer 10 contains a connection contact 10a;10b (see FIG. 2) or 10c;10d (see FIG. 3) or 10e;10f (see FIG. 4) on its surface, in each island of the photo diode 1 or bipolar transistors 4 or 5. Each connection contact 10a;10b, 10c;10d, and 10e;10f includes a larger connection contact 10a or 10c or 10e of the second conductivity type N which larger connection contacts 10a, 10c and 10e are each provided with a smaller connection contact 10b or 10d or 10f, also of the second conductivity type N, doped more heavily with impurities.

Figure 2:
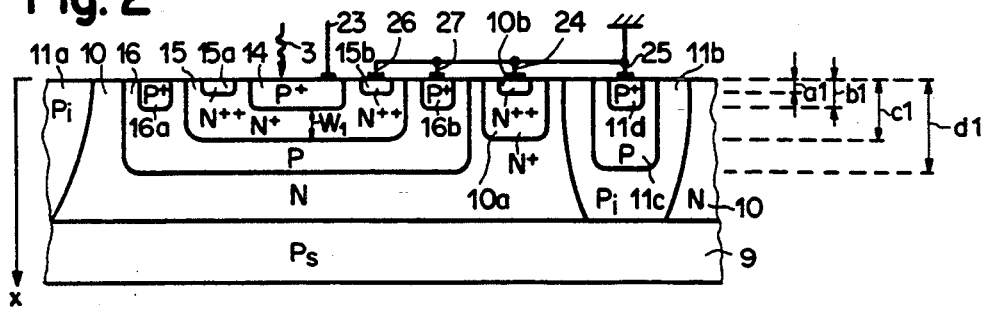
FIG. 2 shows a cross-section of a construction of a known integrated color-selective photo diode in an arrangement according to the present invention.
Figure 3:
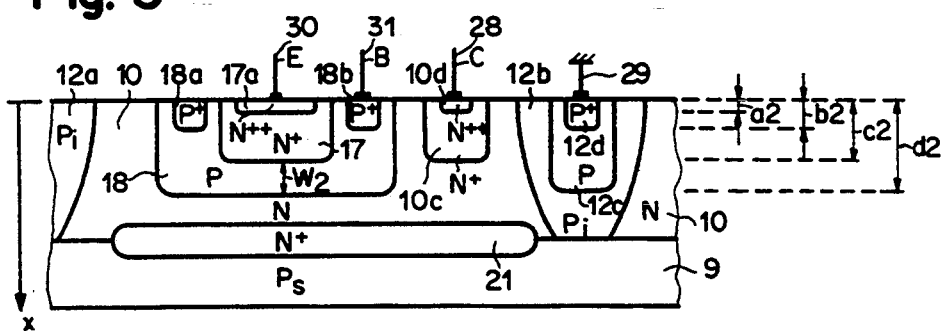
FIG. 3 shows a cross-section of a construction of a vertical bipolar transistor of the amplifier in the arrangement according to the present invention.

The known integrated color-selective photo diode 1 shown in FIG. 2, includes the substrate 9, the epitaxy layer 10 with its connection contact 10a;10b and the isolation ring 11a;11b with its connection contact 11c;11d. In addition, the integrated color-selective photo diode 1 is also provided with a first semiconductor layer 14 of the first conductivity type P installed at the surface in a second semiconductor layer 15 of the second conductivity type N which second semiconductor layer is, in turn, installed at the surface in a third semiconductor layer 16 of the conductivity type P. The third semiconductor layer 16 is installed at the surface in a portion of the epitaxy layer 10 assigned to the photo diode 1 which is surrounded by the isolation ring 11a;11b laterally, in the manner of a ring. A tubular connection contact 15a;15b of the second conductivity type N or 16a;16b of the first conductivity type P is installed at the surface in the second and third semiconductor layer 15 and 16 of the photo diode 1 manner such that the tubular connection contact 15a;15b surrounds the first or the second semiconductor layer 14 or 15 laterally in the manner of a ring. The connection contacts 15a;15b and 16a;16b are represented in FIG. 2 by two cross-sectional surfaces 15a and 15b or 16a and 16b because of their tubular configurations.

Figure 4:
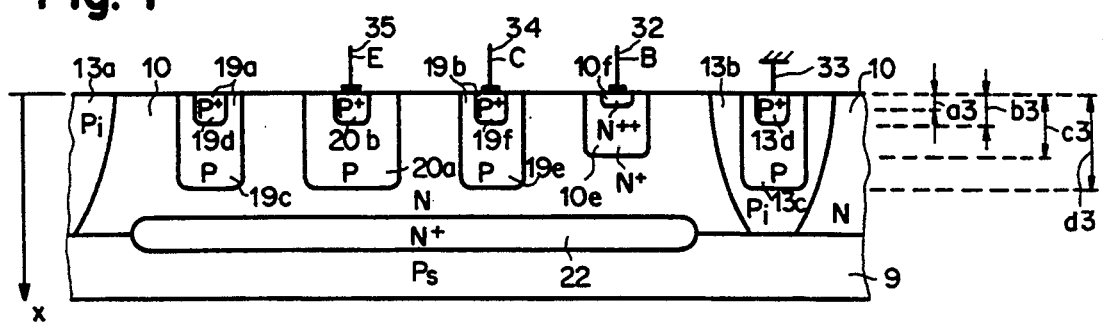
FIG. 4 shows a cross-section of a construction of a lateral bipolar transistor of the amplifier in the arrangement according to the present invention.

The amplifier 2 contains at least the vertical bipolar transistor 4 which is installed and isolated in the same integrated circuit as the photo diode 1 and is electrically isolated from the latter. The vertical bipolar transistor 4 shown in FIG. 3, includes the substrate 9, the epitaxy layer 10 with its connection contact 10c;10d and the isolation ring 12a;12b with its connection contact 12c;12d. The vertical bipolar transistor 4 is furthermore provided with an emitter layer 17 of the second conductivity type N with a doping and a layer thickness c2 similar to those second semiconductor layer 15 of the photo diode 1. The emitter layer 17 is installed at the surface in a base layer 18 of the vertical bipolar transistor 4. The base layer 18 is of the first conductivity type P. Its doping and layer thickness d2 are similar to those of the third semiconductor layer 16 of the photo diode 1. The base layer 18 is installed at the surface in a portion of the epitaxy layer 10 which is assigned to the vertical bipolar transistor 4 and which is surrounded laterally by the isolation ring 12a;12b in the manner of a ring. This portion of the epitaxy layer 10 forms a collector layer of the vertical bipolar transistor 4. A connection contact 17a of the second conductivity type N or 18a;18b of the first conductivity type P is installed at the surface in the emitter layer 17 and in the base layer 18 of the vertical bipolar transistor 4. The connection contact 18a;18b is tubular and is positioned so that it surrounds the emitter layer 17 laterally in the manner of a ring. The connection contact 18a;18b is represented by two cross-sectional surfaces 18a and 18b in FIG. 3 because of its tubular configuration.

if the amplifier 2 contains at least one lateral bipolar transistor 5, the latter is located in the same integrated circuit as the photo diode 1 and the vertical bipolar transistor 4 and is electrically isolated from these two. As shown in FIG. 4, the lateral bipolar transistor 5, includes the substrate 9, the epitaxy layer 10 with its connection contact 10e;10f and the isolation ring 13a;13b with its connection contact 13c;13d. The lateral bipolar transistor 5 also contains a central emitter layer 20a;20b and a tubular collector layer 19a;19b. The latter two are of the first conductivity type P. They have a doping and a layer thickness d3 similar to that of the third semiconductor layer 16 of the photo diode 1. The central emitter layer 20a;20b and tubular collector layer 19a;19b are installed at the surface in a portion of the epitaxy layer 10 assigned to the lateral bipolar transistor which is surrounded laterally by the isolation ring 13a;13b in the manner of a ring. This portion of the epitaxy layer 10 forms a base layer of the lateral bipolar transistor 5. The tubular collector layer 19a;19b is disposed so that it surrounds the central emitter layer 20a;20b laterally in the manner of a ring, separated by semiconductor layer of the epitaxy layer 10. The tubular collector layer 19a;19b includes a larger tubular semiconductor layer 19c;19e. A smaller tubular connection contact 19d;19f, doped more heavily with impurities and of the same first conductivity type P as the larger tubular semiconductor layer 19c;19e is installed at the surface of the larger tubular layer 19c;19e. The emitter layer 20a;20b includes a larger semiconductor layer 20a. A smaller connection contact 20b more heavily doped with impurities and of the same first conductivity type P as the larger semiconductor layer 20a is installed at the surface of the larger semiconductor layer 20a. The semiconductor layers 19a;19b, 19c;19e and 19d;19f are represented in FIG. 4 by two cross-sectional surfaces 19b or 19c and 19e or 19d and 19f because of their tubular configuration.

In order to reduce the resistance value of the collector layer, the vertical bipolar transistor 4 is preferably provided with a so-called "buried layer" 21 at the interface between substrate 9 and the epitaxy layer 10. To produce a diffusion barrier which prevents minority carriers from being diffused from the epitaxy layer 10 into the substrate 9, the lateral bipolar transistor 5 is preferably also provided with a so-called "buried layer" 22 at the interface between substrate 9 and epitaxy layer 10. Each of the "buried layers" 21 and 22 is of the second conductivity type N and is heavily doped with impurities. Each covers the major portion of the bottom of the island in the epitaxy layer 10 which is assigned to the corresponding bipolar transistor 4 or 5.

The amplifier 2 contains at least one integrated resistance 6 which is installed in the same integrated circuit as the photo diode 1 and the bipolar transistors 4 and 5 and is electrically isolated from all of these. A known structure of an integrated resistance 6 shown in FIG. 5 includes the substrate 9, the epitaxy layer 10 and the isolation ring 36a;36b with its connection contact 36c;36d grounded via an external electrical connection 37. In addition, the integrated resistance 6 is also provided with an implanted resistance semiconductor layer 38 of the first conductivity type P with similar doping and layer thickness d4 as the third semiconductor layer 16 of the photo diode 1. The semiconductor layer 38 is installed at the surface in the epitaxy layer 10 of the resistance 6. Two semiconductor connection contacts 39 and 40 of the first conductivity type P, both heavily doped with impurities, are installed at the surface in the resistance semiconductor layer 38.

Figure 5:
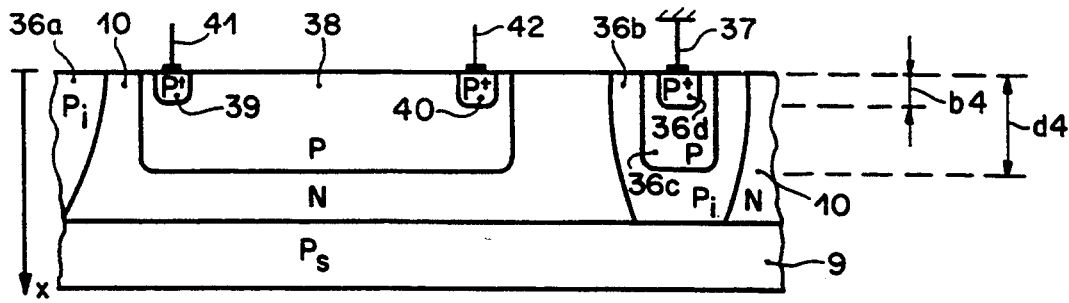
FIG. 5 shows a cross-section of a known construction of an integrated resistance of the amplifier in the arrangement according to the present invention.
Figure 6:
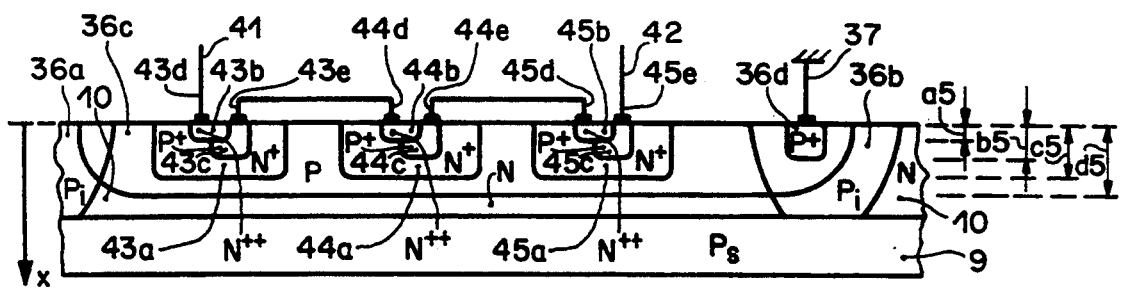
FIG. 6 shows a cross-section of a novel construction of an integrated resistance of the amplifier in the arrangement according to the present invention and FIG. 7 shows a circuit diagram of the integrated resistance shown in FIG. 6.
Figure 7:
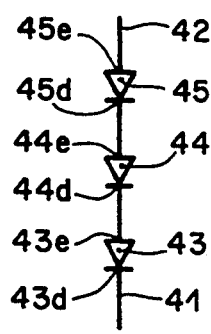

A novel structure of the integrated resistance 6 is shown in FIG. 6. Like the known integrated resistance 6 of FIG. 5, the novel integrated resistance of FIG. 6 also includes the substrate 9, the epitaxy layer 10 and the isolation ring 36a;36b with its connection contact 36c;36d grounded via an external electrical connection 37. The larger connection contact 36c of the connection contact 36c;36d has in this case the configuration of a semiconductor well. The larger connection contact 36c is disposed at the surface in a portion of the epitaxy layer 10 assigned to tile resistance 6 in such a manner that it is contained at least in part in the upper portion of the isolation ring 36a;36b and therefore overlaps it in part. In this case, the smaller connection contact 36d is preferably located in the portion in common to the larger connection contact 36c and of the isolation ring 36a;36b. The semiconductor well 36c of the first conductivity type P is provided with a similar doping and layer thickness d5 as the third semiconductor layer 16 of the photo diode 1. In its novel structure, the resistance 6 is provided with a series connection of several P/N diodes of the same polarity as shown in FIG. 7. It is assumed in both FIG. 6 and FIG. 7 that the resistance 6 is provided with a series connection of three P/N diodes 43, 44 and 45. At the surface in the semiconductor well 36c is a number of smaller mutually separated semiconductor wells 43a, 44a and 45a equal to the number of P/N diodes 43, 44, and 45 in the integrated resistance 6 of FIG. 7. The smaller semiconductor wells 43a, 44a and 45a are electrically isolated from each other by the semiconductor material of the semiconductor well 36c. The smaller semiconductor wells 43a, 44a and 45a are all provided with a similar doping and layer thickness c5 as the second semiconductor layer 15 of the photo diode 1. Two connection contacts 43b and 43c or 44b and 44c or 45b and 45c which overlap each other at least in part and are heavily doped with impurities are installed at the surface in each smaller semiconductor well 43a, 44a and 45a. A first one of the two connection contacts 43c or 44c or 45c is in this case of the first conductivity type P and a second of the two connection contacts 43b, 44b and 45b is of the second conductivity type N.

The resistance 6 of the amplifier 2 can be a resistance as shown in FIG. 5 or a resistance as shown in FIG. 6, or a combination of the two types of resistances. In the latter case, it is a suitable series or parallel connection of the two types of resistances.

The resistance 6 shown in FIG. 5 has a positive temperature coefficient and a maximum resistance value of 1 MΩ. The resistance shown in FIG. 6 has a negative temperature coefficient and a resistance value of approximately 100 kΩ to approximately 1 GΩ. Because of the high doping N++ or P+ and the shallow depths of the connection contacts 43b, 43c, 44b, 44c, 45b and 45c, a tunnel effect of the charge carriers is produced in the latter resistance at the passage between each of the two overlapping connection contacts 43b and 43c or 44b and 44c or 45b and 45c with a low voltage in the order of millivolts. Thus, the diodes 43, 44 and 45 function in the manner of a kind of "backward diode" and have a nearly linear voltage/current curve in the range of approximately −50 mV to +50 mV. Through proper selection of a series and/or parallel connection of the two types of resistances, an integrated resistance 6 in an order of magnitude from 10 MΩ to 100 MΩ having a predetermined temperature coefficient, e.g. −0.5%/° Kelvin, can be realized. Because each of the two bipolar transistors 4 and 5 typically has a positive temperature coefficient for its current amplification, e.g.=0.25%/° Kelvin, the arrangement according to the invention can be rendered insensitive to temperature with a negative coefficient of the resistance 6.

To indicate the different doping used in the different Layers of FIGS. 2–6, the doping of the semiconductor material of substrate 9 is designated by $P_s$ ("$P_{substrate}$"), the doping of the isolation rings 11a;11b, 12a;12b, 13a;13b and 36a;36b is designated by $P_i$ ("$P_{isolation}$"), that of the semiconductor layers 16, 18 and 38 as well as of the connection contacts 11c, 12c, 13c, 19c;19e, 20a and 36c by P and that of the semiconductor layer 14 and of the connection contacts 11d, 12d, 13d, 16a;16b, 18a;18b, 19d;19f, 20b, 39, 40, 43c, 44c and 45c by P+. The latter semiconductor material is doped more heavily with impurities, preferably boron atoms, than the semiconductor material designated by P. The semiconductor material of the epitaxy layer 10 is designated by N, that of the semiconductor layers 15, 17, 21 and 22, of the semiconductor wells 43a, 44a and 45a and of the connection contacts 10a, 10c and 10e by N+ and that of the connection contacts 10b, 10d, 10f, 15a;15b, 17a, 43b, 44b and 45b by N++. The latter semiconductor material is more heavily doped with impurities, preferably phosphorus atoms, than the semiconductor material designated by N+ which in turn is more heavily doped with impurities, preferably phosphorus atoms, than the semiconductor material designated by N.

In the photo diode 1, an inlet window permeable to the light 3 is provided on the first semiconductor layer 14 and is structured similarly as the inlet window known from U.S. Pat. No. 4,910,570 A. The anti-reflection coating of the window acts as an interference filter. The integrated circuit according to the invention is contained in a housing which is preferably made of transparent plastic and assumes the role of the color filter which is placed in front of the interference filter in the state of the art.

The semiconductor layer 14 as well as each of the connection contacts 10b, 11d, 15a;15b, 16a;16b, 10d, 12d, 17a, 18a;18b, 10f, 13d, 19d;19f, 20b, 36d, 39, 40, 43b, 43c, 44b, 44c, 45b and 45c has an electrical connection 23, 24, 25, 26, 27, 28, 29, 30, 31, 32, 33, 34, 35, 37, 41, 42, 43d, 43e, 44d, 44e, 45d or 45e which is shown in the drawing as a wire connection. In practice, the electrical connections 23, 24, 25, 26, 27, 28, 29, 30, 31, 32, 33, 34, 35, 37, 41, 42, 43d, 43e, 44d, 44e, 45d or 45e are formed by a so-called metallization situated on the surface of the integrated circuit. The electrical connections 24, 25, 26, 27, 29, 33 and 37 are all connected to each other and to the ground (see FIGS. 2, 3 and 4), so that the photo diode 1, the semiconductor layers 15 and 16, the epitaxy layer 10 and the isolation rings 11a;11b are all grounded. The connection 23 serves as the anode connection of the photo diode 1. The connections 30, 31 and 28 serve as an emitter connection E, a base connection B and a collector connection C, respectively, of the vertical bipolar transistor 4 (see FIG. 3). The connections 35, 34 and 32 serve as an emitter connection E, a collector connection C and a base connection B, respectively, of the lateral bipolar transistor 5 (see FIG. 4). The electrical connections 41 and 42 serve as the two connections of the resistance 6 shown in FIG. 5. The electrical connection 43e (see FIG. 6) is connected externally by means of metallization, for example, to the electrical connection 44d and the electrical connection 44e is connected externally to the electrical connection 45d, so that the diodes 43 to 45 forming the integrated resistance 6 are of the same polarity and are connected electrically series. The electrical connection 43d then serves as the first terminal 41 of the diode series connection 43;44;45 and thereby of resistance 6, while the electrical connection 45e serves as the second terminal 42 of the diode series connection 43;44;45 and thereby of resistance 6.

The two semiconductor layers 14 and 15 form the PN layers of photo diode 1, while the semiconductor layers 17, 18 and 10 are the emitter, base and collector layers of the vertical bipolar transistor 4. The semiconductor layers 20a, 19c;19e and 10 form the emitter, collector and base layers of the lateral bipolar transistor 5 which has the substrate 9 as an additional collector, i.e., as a parasitic collector 8. The layers 20a, 10;22 and 9 form a parasitic vertical bipolar transistor of type PNP in the lateral bipolar transistor 5, distinguishing itself from the lateral bipolar transistor 5 only through the collector layer 9 or 19c;19e. The "buried semiconductor layer" 21 and the substrate 9 vertical bipolar transistor 4 form the parasitic diode 7. "The layers 43c and 43a or 44c and 44a or 45c and 45a form the P/N layers of the P/N diodes 43 or 44 or 45, respectively.

Each of the connection contacts 15a;15b and 10b of the photo diode 1 has a layer thickness a1, each of the connection contacts 17a and 10d of the vertical bipolar transistor 4 has a layer thickness a2, the connection contact 10f of the lateral bipolar transistor 5 has a layer thickness a3 and each of the connection contacts 43b, 44b and 45b of the novel resistance 6 has a layer thickness a5. All four thicknesses, a1, a2, a3 and a5 are nearly equal.

The first semiconductor layer 14 and each of the connection contacts 16a;16b and 11d of the photo diode 1 has a layer thickness b1, each of the connection contacts 18a;18b and 12d of the vertical bipolar transistor 4 has a layer thickness b2, each of the connection contacts 19d;19f, 20b and 13d of the lateral bipolar transistor 5 has a layer thickness b3, each of the connection contacts 39 and 40 has a layer thickness b4 and each of the connection contacts 43c, 44c and 45c has a layer thickness b5. All five thicknesses, b1, b2, b3, b4 and b5 are nearly equal.

The second semiconductor layer 15 and the connection contact 10a of the photo diode 1 each has a layer thickness c1, the emitter layer 17 and the connection contact 10c of the vertical bipolar transistor 4 each has a layer thickness c2, the connection contact 10e of the lateral bipolar transistor 5 has a layer thickness c3 and each of the semiconductor wells 43a, 44a and 45a has a layer thickness c5. All four thicknesses, c1, c2, c3 and c5 are nearly equal.

The third semiconductor layer 16 and the connection contact 11c of the photo diode 1 each has a layer thickness d1, the base layer 18 and the connection contact 12c of the vertical bipolar transistor 4 each has a layer thickness d2, the emitter layer 20a;20b, the collector layer 19a;19b and the connection contact 13c of the lateral bipolar transistor 5 each has a layer thickness d3 and the connection contact 36c of the resistance 6 has a layer thickness d4 (see FIG. 5) or d5 (see FIG. 6). All five thicknesses, d1, d2, d3, d4 and d5 are nearly equal.

The values of the N+ doping and the active layer thickness $W_1 = c1 - b1$ of the semiconductor layer 15 of photo diode 1 located below the first semiconductor layer 14 as well as the values of the P doping and of the active layer thickness $W_2 = d2 - c2$ of the base layer 18 of the vertical bipolar transistor 4 located below the emitter layer 17 are selected in such manner according to the invention that the inequality $$\int_{W_1} Y \cdot dx > \int_{W_2} Z \cdot dx$$

is met. The parameter x in this case is a coordinate in a direction X that is perpendicular to the surface of the integrated circuit.

Finally, the invention has been described above with reference to illustrative embodiments. Numerous other embodiments may be devised by those having ordinary skill in the art without departing from the spirit and scope of the following claims.

I claim:

1. An integrated photo diode amplifier circuit comprising:
    a photo diode comprising:
        a first electrically isolated portion of an epitaxial layer of a first conductivity type,
        a first semiconductor layer of a second conductivity type disposed in said electrically isolated epitaxial layer portion at a surface of said integrated circuit,
        a second semiconductor layer of said first conductivity type disposed in said first semiconductor layer at said integrated circuit surface, and
        a third semiconductor layer of said second conductivity type disposed in said second semiconductor layer at said integrated circuit surface, and
    a vertical bipolar transistor connected downstream from said photo diode comprising:
        a collector layer comprising a second electrically isolated portion of said epitaxial layer of said first conductivity type,
        a base layer of said second conductivity type, disposed in said second electrically isolated portion of said epitaxial layer at said surface of said integrated circuit, said base layer being approximately as thick, in a direction X perpendicular to said integrated circuit surface, and being doped with an approximately equal concentration of impurities, as said first semiconductor layer,
        an emitter layer of said first conductivity type disposed in said base layer at said integrated circuit surface, said emitter layer being approximately as thick, in said direction X, and being doped with an approximately equal concentration of impurities, as said second semiconductor layer,
    wherein said second semiconductor layer is doped with a concentration Y of impurities and has an active region located below said third semiconductor layer with a thickness $W_1$ in said direction X, and wherein said base layer is doped with a concentration Z of impurities and has an active region with a thickness $W_2$ in said direction X such that $$\int_{W_1} Y \cdot dx > \int_{W_2} Z \cdot dx$$

where x is measured in said direction X.

2. The integrated circuit of claim 1 further comprising a lateral bipolar transistor connected downstream from said vertical bipolar transistor, said lateral bipolar transistor comprising:
    a base layer comprising a third electrically isolated portion of said epitaxial layer of said first conductivity type,
    a central emitter layer of said second conductivity type located in said third electrically isolated portion of said epitaxial layer at said surface of said integrated circuit, amid
    a tubular collector layer of said second conductivity type disposed in said third electrically isolated portion of said epitaxial layer at said surface of said integrated circuit, the axis of said tubular collector layer being approximately perpendicular to said surface of said integrated circuit, said tubular collector layer surrounding a part of said third electrically isolated portion which part surrounds said central emitter layer,
    wherein said central emitter layer and said tubular collector layer are as thick in said direction X, and are doped with approximately equal concentrations of impurities, as said first semiconductor layer.

3. The photo diode amplifier integrated circuit of claim 1 wherein said amplifier further comprises an integrated resistance formed by a series connection of a plurality of P/N diodes with the same polarity.

4. The photo diode amplifier integrated circuit of claim 3 further comprising:
    a third electrically isolated portion of said epitaxial layer of said first conductivity type,
    a first semiconductor well of said second conductivity type disposed in said third electrically isolated portion of said epitaxial layer at said surface of said integrated circuit, said first semiconductor well being doped with an approximately equal concentration of impurities, and having an approximately equal thickness in said direction X as said first semiconductor layer,
    a plurality of smaller semiconductor wells of said first conductivity type, which each corresponds to a different one of said P/N diodes, disposed in said first semiconductor well at said surface of said integrated circuit, each smaller semiconductor well being electrically isolated from each other, being doped with an approximately equal concentration of impurities and having an approximately equal thickness in said direction X as said second semiconductor layer, and comprising two, at least partly, mutually overlapping connection contacts of opposite conductivity types heavily doped with impurities, said connection contacts being disposed in said smaller semiconductor well at said integrated circuit surface.

5. The photo diode amplifier integrated circuit of claim 1 further comprising a transparent plastic housing.

* * * * *